(12) United States Patent
Takemori et al.

(10) Patent No.: US 8,703,363 B2
(45) Date of Patent: Apr. 22, 2014

(54) REFLECTION HOLOGRAM STORAGE METHOD

(75) Inventors: Michael T. Takemori, Rexford, NY (US); Andrew A. Burns, Niskayuna, NY (US); Mark A. Cheverton, Mechanicville, NY (US); Sumeet Jain, Schenectady, NY (US); Sora Kim, Niskayuna, NY (US)

(73) Assignee: Sabic Innovative Plastic IP B.V. (NL)

( * ) Notice: Subject to any disclaimer, the term of this patent is extended or adjusted under 35 U.S.C. 154(b) by 82 days.

(21) Appl. No.: 13/028,529

(22) Filed: Feb. 16, 2011

(65) Prior Publication Data

US 2012/0208109 A1     Aug. 16, 2012

(51) Int. Cl.
*G03H 1/02* (2006.01)
*G03F 7/00* (2006.01)
*G03H 1/26* (2006.01)
*G03H 1/04* (2006.01)

(52) U.S. Cl.
CPC ....... *G03H 1/265* (2013.01); *G03H 2001/0216* (2013.01); *G03H 2001/0415* (2013.01); *G03H 2223/18* (2013.01); *G03H 2223/25* (2013.01)
USPC .......... 430/2; 430/1; 359/22; 359/24

(58) Field of Classification Search
None
See application file for complete search history.

(56) References Cited

U.S. PATENT DOCUMENTS

| | | | | |
|---|---|---|---|---|
| 3,695,744 A | * | 10/1972 | Clay | 359/24 |
| 3,860,950 A | * | 1/1975 | Wick et al. | 348/41 |
| 4,943,126 A | * | 7/1990 | Lang et al. | 359/12 |
| 5,115,336 A | * | 5/1992 | Schildkraut et al. | 359/263 |
| 5,330,264 A | * | 7/1994 | Ando et al. | 359/12 |
| 5,648,857 A | * | 7/1997 | Ando et al. | 359/12 |
| 5,781,317 A | * | 7/1998 | Kawazoe et al. | 359/12 |
| 5,859,714 A | * | 1/1999 | Nakazawa et al. | 359/13 |

(Continued)

FOREIGN PATENT DOCUMENTS

| | | |
|---|---|---|
| EP | 0864947 A2 | 9/1998 |
| JP | 02-240679 * | 9/1990 |
| JP | 07-230243 * | 8/1995 |
| WO | WO2007042176 A1 | 4/2007 |

OTHER PUBLICATIONS

Cao et al., Angle amppplifier based on multiplexed volume holographic gratings. Proc Spie vol. 6832 (6 pages) (2007).*

(Continued)

*Primary Examiner* — Martin Angerbranndt
(74) *Attorney, Agent, or Firm* — Cantor Colburn LLP (57) ABSTRACT

A method is described for recording a volume reflection holographic image that is viewable when illuminated by light at a wavelength $W_v$. The method includes
  providing a transparent holographic recording medium having a refractive index n, said holographic recording medium being photosensitive to external light provided at a wavelength W that is different than $W_v$;
  disposing a first transparent refracting medium in contact with a first surface of the holographic recording medium; and
  exposing the holographic recording medium to a signal coherent light source that includes image or other information to be recorded in the holographic recording medium and a reference coherent light source, the signal coherent light source and reference coherent light source emitting light at the wavelength W and entering the holographic recording medium through opposing surfaces thereof, wherein the signal coherent light source or the reference coherent light source passes through the first transparent refracting medium before entering the holographic recording medium at an internal angle of incidence greater than arcsin(1/n).

7 Claims, 4 Drawing Sheets

(56) References Cited

U.S. PATENT DOCUMENTS

| | | | |
|---|---|---|---|
| 6,151,142 | A | 11/2000 | Phillips et al. |
| 6,274,860 | B1 * | 8/2001 | Rosenberg ................ 250/203.4 |
| 6,284,418 | B1 * | 9/2001 | Trantolo ........................ 430/20 |
| 6,597,475 | B1 * | 7/2003 | Shirakura et al. ............... 359/12 |
| 7,727,680 | B2 * | 6/2010 | Ueda et al. ........................ 430/1 |
| 2004/0008391 | A1 * | 1/2004 | Bowley et al. ..................... 359/3 |
| 2007/0174854 | A1 * | 7/2007 | Jungermann et al. ......... 720/600 |
| 2008/0084592 | A1 * | 4/2008 | Boden et al. ....................... 359/2 |
| 2008/0158627 | A1 * | 7/2008 | Lawrence et al. ................. 359/7 |
| 2009/0272805 | A1 | 11/2009 | Riddle et al. |
| 2010/0027082 | A1 | 2/2010 | Wiltshire |
| 2010/0328741 | A1 * | 12/2010 | Cheverton et al. ................ 359/2 |
| 2012/0178019 | A1 * | 7/2012 | Jain et al. ........................... 430/2 |

OTHER PUBLICATIONS

Sutherland et al., "evolution of anisotropic reflection gratings formed in hologrpahic polymer-dispersed liquid crystals"., Appl. Phys. Lett., vol. 79(10) pp. 1420-1422 (Sep. 2001).*

Eichler et al. "holographic reflection gratings in azobenzene polymers", Opt. Lett., vol. 26(9) pp. 581-583 (May 2001).*

Semenova "Highly selective spectral optical elements on the base of very thick holograms", Final report Contract F617755-98-we130 (7 pages) (Aug. 1999).*

Bjelkhagen, Hans I. and Mirlis, Evangelos, "Color holography to produce highly realistic three-dimensional images," Applied Optics, vol. 47, No. 4, pp. A123-A133, United States (Feb. 1, 2008).

P. Hariharan, "Colour Holography," Progress in Optics XX, Chap. 4, pp. 265-334, Elsevier, North Holland (1983).

Tamura, Poohsan N., "Pseudocolor encoding of holographic images using a single wavelength," Applied Optics, vol. 17, No. 16, pp. 2532-2536, United States (Aug. 15, 1978).

Rich, Chris and Peterson, Joel, "Broadband IR Lippmann Holograms for Solar Control Applications", Practice Holography VI, SPIE vol. 1667, pp. 165-171(1992).

International Search Report for International Application No. PCT/US2012/025235, mailed May 24, 2012, 4 pages.

Written Opinion of the International Searching Authority for International Application No. PCT/US2012/025235, mailed May 24, 2012, 8 pages.

M. Date et al., "Three-Primary Holographic Polymer Dispersed Liquid Crystal (HPDLC) Devices for Reflective Displays", Asia Display '95, 1995, pp. 603-606, as cited in prosecution history of US Patent 6,278,506.

* cited by examiner

REFLECTION HOLOGRAM STORAGE METHOD

BACKGROUND

The present disclosure relates to holograms, methods of making and using holograms, and more particularly to polychromatic holograms. Articles incorporating the polychromatic holograms are also disclosed.

Volume holograms are an increasingly popular mechanism for the authentication of genuine articles, whether it is for security purposes or for brand protection. The use of volume holograms for these purposes is driven primarily by the relative difficulty with which they can be duplicated. Volume holograms are created by interfering two coherent beams of light to create an interference pattern and storing that pattern in a holographic recording medium. Information or imagery can be stored in a hologram by imparting the data or image to one of the two coherent beams prior to their interference. The hologram can be read out by illuminating it with a beam of light matching the geometry and wavelength of either of the two original beams used to create the hologram and any data or images stored in the hologram will be displayed. Typically, holograms can be read out by other light wavelengths that satisfy the Bragg diffraction condition at suitably adjusted angles of incidence and divergence. As a result of the complex methods required to record holograms, their use for authentication can be seen on articles such as credit cards, software, passports, clothing, and the like.

The most common types of volume holograms are transmission holograms and reflection holograms. To form any volume hologram, two light beams are used. One beam, known as the signal beam, carries the image information to be encoded in the hologram. The second beam can be a plane wave or a convergent/divergent beam with no information, also known as the reference beam. The object (or signal) beam and the reference beam generate an interference pattern, which is recorded in the form of a diffraction grating within the holographic medium. A transmission hologram is created when both object and reference beams are incident on the holographic medium from the same side, and is so called because in viewing the hologram, the light must pass through the holographic material to the viewer.

On the other hand, during the recording of a reflection hologram, the reference beam and the object beam illuminate the holographic medium from opposite sides, and the hologram is viewed from the same side of the material as it is illuminated. Generally, a reflection hologram only reflects light within a narrow band of wavelengths around the writing wavelength. Because of this, the holographic image created by a reflection hologram tends to appear monochromatic. The interference fringes in the holographic material are formed by standing waves generated when the two beams, traveling in opposite directions, interact. The fringes formed are in layers substantially parallel to the surface of the film. Generally, reflection holograms will only reflect wavelengths that are the same as or close to the fringe spacing of the hologram, which is determined by the writing wavelength ($\lambda$). Therefore, for a particular writing wavelength ($\lambda$), the hologram will appear monochromatic and reflect only wavelengths close to $\lambda$.

Considerable efforts have been made to develop multi-color reflection holograms. In a conventional approach to multi-color reflection holography, beams of coherent light in each of the primary (additive) colors (red, green, and blue) are used to record distinct holograms in the holographic media plate. In practice, registration of the three images is very difficult, particularly for large plates, insofar as the focus and/or magnification of each beam is dependent on its wavelength; good registration requires careful angular adjustment of the beams. The need for additional reference light sources (e.g., a blue light laser and a green light laser, as well as a red light laser) also adds a substantial complexity and cost to the system. Moreover, the recording medium (e.g., a photographic emulsion or photopolymer) typically exhibits different sensitivities at different wavelengths, dictating careful control of the exposure time and intensity of each beam as well. Also, many types of holographic recording media are not readily prepared with sensitivities to each of the primary light colors. For example, holographic recording media using photochemically active dyes may impart unwanted coloration (through absorbance) that may aesthetically interfere with the color image produced by the holographic diffraction grating. Other techniques for expanding the differential between the writing wavelength and the viewing wavelength have involved physical deformation of the recording medium such as by swelling with a solvent prior to exposure, followed by drying and shrinking the medium after exposure. However, such techniques increase the complexity of the recording process and may not be feasible with many types of recording media.

Thus, there remains a need for improved methods of making reflection holograms. More particularly, there remains a need for simpler, more cost effective methods of making complex, e.g., multicolor, holograms.

SUMMARY

Disclosed herein are methods of making polychromatic holograms and articles comprising the polychromatic holograms, and methods for use thereof In one exemplary embodiment, a method is provided for recording a volume reflection holographic image that is viewable when illuminated by light at a wavelength $W_v$, comprising providing a transparent holographic recording medium having a refractive index n, said holographic recording medium being photosensitive to external light provided at a wavelength W that is different than $W_v$;

disposing a first transparent refracting medium in contact with a first surface of the holographic recording medium; and exposing the holographic recording medium to a signal coherent light source that includes image or other information to be recorded in the holographic recording medium and a reference coherent light source, the signal coherent light source and reference coherent light source emitting light at the wavelength W and entering the holographic recording medium through opposing surfaces thereof, wherein the signal coherent light source or the reference coherent light source passes through the first transparent refracting medium before entering the holographic recording medium at an internal angle of incidence greater than $\arcsin(1/n)$.

In another exemplary embodiment, a method of recording a volume reflection holographic image that is viewable at an angle of incidence $S_v$ when illuminated by light at a wavelength $W_v$ at an angle of incidence $R_v$ is provided, comprising:

providing a transparent holographic recording medium having a refractive index n, the holographic recording medium being photosensitive to external light provided at a wavelength W that is different than $W_v$; and exposing the holographic recording medium to a signal coherent light source that includes image or other information to be recorded in the holographic recording medium and a reference coherent light source, the signal coherent light source and reference coherent light source emitting light at the wavelength W and entering the holographic recording medium through opposing surfaces thereof and producing angles of incidence within the holographic recording medium of Φ for the reference light source and θ for the signal light source, wherein either or both of Φ or θ must be greater than arcsin(1/n) in order to satisfy the equations:

$$\cos\left(\frac{\Phi+\theta}{2}\right) = \frac{W\cos\left(\frac{\arcsin\left(\frac{\sin R_v}{n}\right)+\arcsin\left(\frac{\sin S_v}{n}\right)}{2}\right)}{W_v} \text{ and}$$

$$\Phi - \theta = \arcsin\left(\frac{\sin R_v}{n}\right) - \arcsin\left(\frac{\sin S_v}{n}\right),$$

wherein 0≤Φ+θ≤180°;

wherein whichever of the signal light source and the reference light source requires an angle of incidence within the holographic recording medium of greater than arcsin(n) enters the holographic recording medium from a transparent refracting medium in contact optically coupled with the holographic medium and having a refractive index $n_r$ so that the required internal angles of incidence are less than arcsin $(n/n_r)$.

In yet another exemplary embodiment, a holographic article is provided comprising a holographic recording medium having a reflection holographic grating therein formed by photoreacted areas of a photochemically active dye and unreacted areas of the photochemically active dye, wherein said photochemically active dye is sensitive to light at a first wavelength W and said reflection holographic grating is viewable under light at a second wavelength $W_v$ that differs from the first wavelength W by at least 75 nm.

BRIEF DESCRIPTION OF THE DRAWINGS

Referring now to the Figures, which represent exemplary embodiments and wherein like elements may be numbered alike.

DETAILED DESCRIPTION

In an exemplary embodiment, disclosed herein are methods of making volume reflection holograms where the wavelength of the exposure light source differs from the wavelength of the viewing light source. In another exemplary embodiment, the methods disclosed herein may be used to record complex (e.g., multicolored, images such as animation, etc.) holograms. In yet another exemplary embodiment, the methods disclosed herein may be used for making multicolored reflection holograms using a single laser light source.

The methods disclosed herein may be utilized with virtually any type of recording medium capable of exhibiting interference fringe patterns for the recording of reflection volume holograms. Such media may include media that comprise photochemically active dye(s) dispersed in a binder such as a thermoplastic binder as disclosed, for example, in U.S. patents or published patent applications US 2006/0078802A1, US 2007/0146835A1, U.S. Pat. Nos. 7,524,590, 7,102,802, US 2009/0082580A1, US 2009/0081560A1, US 2009/0325078A1, and US 2010/0009269A1, the disclosures of which are incorporated herein by reference in their entirety. Other media with which the methods disclosed herein may be used include photopolymer holographic recording media (as disclosed in e.g., U.S. Pat. Nos. 7,824,822 B2, 7,704,643 B2, 4,996,120 A, 5,013,632 A), dichromated gelatin, liquid crystal materials, photographic emulsions, and others as disclosed in P. Hariharan, *Optical Holography—Principles, techniques, and applications* $2^{nd}$ ed., Cambridge University Press, 1996, the disclosures of each of which are incorporated herein by reference in their entirety.

Figure 1:
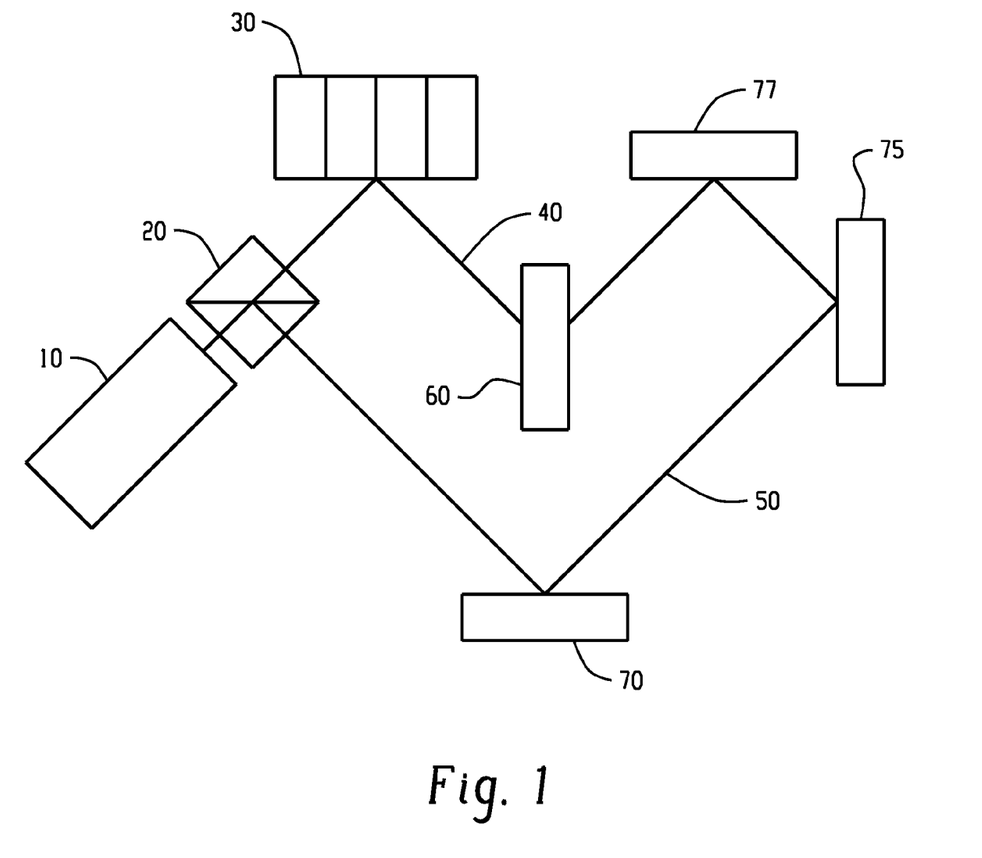
FIG. 1 depicts a typical apparatus configuration for the recording of a volume reflection hologram.

A typical configuration of a system for recording a volume reflection hologram is shown in FIG. 1. In this configuration, the output from a laser 10 is divided into two equal beams by beam splitter 20. One beam, the signal beam 40, is incident on a form of spatial light modulator (SLM), digital light projector (DLP), deformable mirror device (DMD), mask or object to be recorded 30, which imposes the image or data to be stored in signal beam 40. An SLM or DMD device may be composed of a number of pixels that can block or transmit the light based upon input electrical signals. Each pixel can represent a bit or a part of a bit (a single bit can consume more than one pixel of the SLM or DMD 30) of data to be stored. The output of SLM/DMD/object 30 in the form of the signal beam enters holographic recording medium 60. The second beam, the reference beam 50, is transmitted to holographic recording medium 60 by reflection off mirrors 70, 75, and 77 with minimal distortion. The two beams are coincident on the same area of holographic recording medium 60 from different directions. The net result is that the two beams create an interference pattern at their intersection in the holographic recording medium 60. The interference pattern is a unique function of the data or image information imparted to signal beam 40 by SLM/DMD/object 30.

Figure 2A:
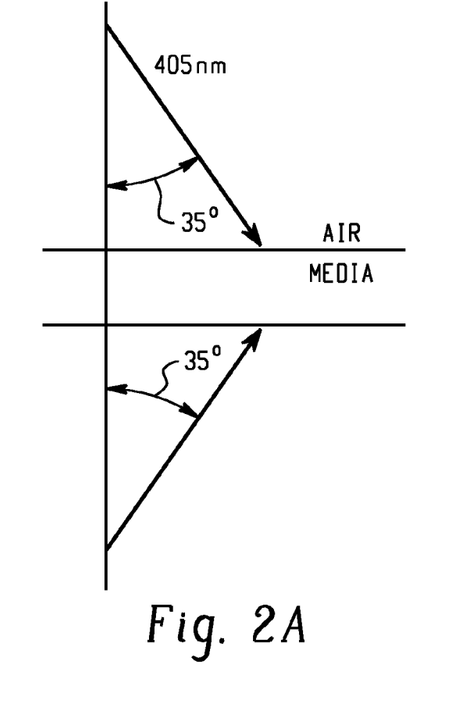
FIGS. 2A-2C illustrate a Bragg diagram for conventional prior art recording of a volume reflection hologram.
Figure 2B:
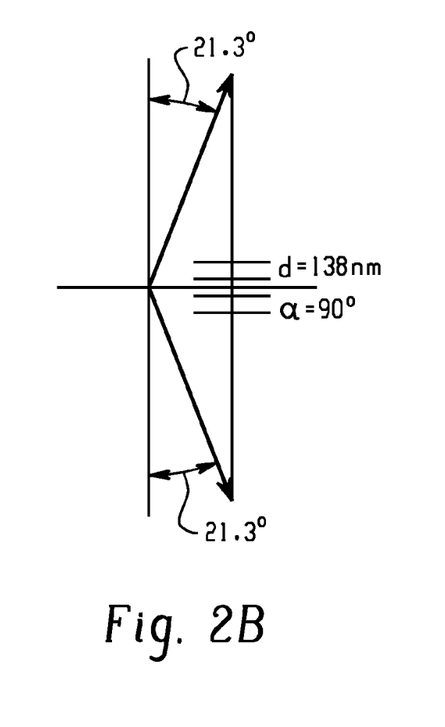
Figure 2C:
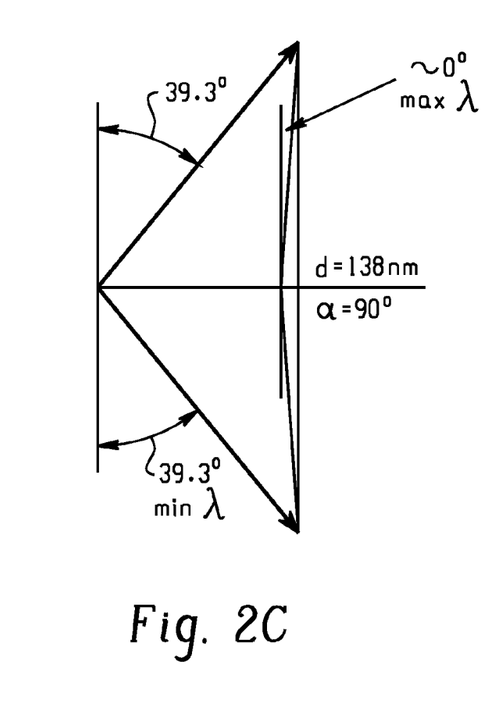

The optical light path geometry involved in the recording of a typical conventional reflection hologram is illustrated in FIG. 2A. In FIG. 2A, symmetric 405 nm signal light beam 205 and reference light beam 210 impinge on opposite surfaces of holographic recording medium 260 at angles of incidence of (in this case) 35°. The internal optics that produce a diffraction grating fringe pattern in the holographic recording medium are shown in the Bragg diagram depicted in FIG. 2B. After entering the recording medium with a refractive index of 1.58, the light beams are diffracted to a reference internal angle of incidence Φ and a signal internal angle of incidence θ of 21.3° each, and pursuant to Bragg's Law, produce a diffraction grating having a fringe spacing δ of 138 nm and a fringe angle α of 90°. The diffraction grating, once recorded, can subsequently diffract light over a range of wavelengths depending on the angle at which the viewing light impinges on the grating. FIG. 2C is a Bragg diagram depicting the maximum and minimum light wavelengths at which the diffraction grating can be viewed, pursuant to Bragg's Law. The maximum viewable wavelength of 435 nm occurs when the illuminating light is at an angle normal to the holographic recording medium (which in this case is also normal to the grating since the fringe angle is 90°). The minimum wavelength of 337 nm occurs as the illumination external angle of incidence approaches 90°, which produces an internal angle of incidence of 39.3°. However, the normal and virtually parallel angles of illumination are often not practical for many applications, so the relevant wavelength range at which the hologram may be viewed may be significantly smaller. The methods described herein are especially useful for producing exposure/viewing wavelength differentials of at least 75 nm, which often cannot be produced by conventional holographic exposure techniques. In a more specific exemplary embodiment, the wavelengths at which writing can be accomplished can be from 350 nm to 750 nm (for writing wavelengths of e.g., 405 nm). In one exemplary embodiment, reading/viewing can be performed at wavelengths between 400 and 500 nm (i.e., blue light). In another exemplary embodiment, reading/viewing can be performed at wavelengths between 500 and 600 nm (i.e., green light). In yet another exemplary embodiment, reading/viewing can be performed at wavelengths between 600 and 750 nm (i.e., red light). In one embodiment, the writing and reading are accomplished at a wavelength of 300 to 500 nanometers. In another embodiment, the writing and reading are accomplished at a wavelength of 400 to 550 nanometers. Exemplary wavelengths at which writing may be accomplished are 405 nanometers and 532 nanometers.

The methods described herein rely at least in part on the recognition that in traditional reflection holography, signal or reference beams having an angle of incidence in a recording medium below the critical angle of incidence for that medium will produce holograms that are viewable at wavelengths that differ by only a limited amount from the exposure wavelength (for given exposure wavelengths and angles and desired viewing wavelengths and angles). Conditions where the critical angle of incidence for the recording medium prevent the desired exposure/viewing wavelength differential can be characterized by condition where either or both of $\Phi$ or $\theta$ must be greater than $\arcsin(1/n)$ to satisfy the set of equations $$\cos\left(\frac{\Phi+\theta}{2}\right) = \frac{W\cos\left(\frac{\arcsin\left(\frac{\sin R_v}{n}\right)+\arcsin\left(\frac{\sin S_v}{n}\right)}{2}\right)}{W_v} \text{, and} \quad (1)$$

$$\Phi - \theta = \arcsin\left(\frac{\sin R_v}{n}\right) - \arcsin\left(\frac{\sin S_v}{n}\right), \quad (2)$$

where W represents the exposure wavelength, $\Phi$ represents the internal angle of incidence of the reference exposure light source within the holographic recording medium, $\theta$ represents the internal angle of incidence of the signal exposure light source within the holographic recording medium, $W_v$ represents the external illumination wavelength for viewing, $R_v$ represents the external angle of incidence of illumination for viewing, $\Phi+\theta$ range from 0° to 180°. The internal angles of incidence for the signal and reference exposure light sources may be readily determined from the external angles of incidence by the Snell's Law equations $\theta=\arcsin(S/n)$ and $\Phi=\arcsin(R/n)$ where S represents the external exposure signal angle of incidence and R represents the external exposure reference angle of incidence.

After the methods described herein have been utilized to identify that a set of conditions exist where the critical angle of incidence for the recording medium will prevent a desired exposure/viewing wavelength differential, the exposure/viewing wavelength differential can be readily expanded through the use of a transparent refractive medium (e.g., a prism) optically coupled to either or both surfaces of the holographic recording medium. The refractive index and geometry of the transparent refractive medium can be appropriately chosen to enable either or both of the signal or reference exposure light sources to enter the holographic recording medium at angles of incidence greater than the critical angle of incidence for the holographic recording medium in air. In order to increase the achievable angle of incidence as light passes from the transparent refractive medium to the holographic recording medium, the transparent refractive medium may have a refractive index that is greater than, equal to, or less than but close to the refractive index of the holographic recording medium. In one exemplary embodiment, the refractive index of the transparent refractive medium is less than the refractive index of the holographic recording medium by less than 0.4, or is equal to or greater than the refractive index of the holographic recording medium. As a practical matter, many common transparent materials such as glass or various plastics have a refractive index near 1.5 and will be suitable as paired holographic recording media and transparent refracting media.

By "optically coupled to", it is meant that light can pass directly from the transparent refractive medium to the holographic recording medium without passing through any gap (e.g., air) that would subject the light to refraction upon entering the holographic recording medium that would impose a critical angle of incidence limitation leading to unwanted restriction upon the exposure/viewing wavelength differential. This may be accomplished by placing planar smooth surfaces of the two materials in intimate contact with one another. Even minor deviations from planar for the juxtaposed surfaces of the holographic recording medium and transparent refracting medium can cause gaps and unwanted light refraction, so in an exemplary embodiment, a liquid or gel transparent refracting material can be disposed in the interface between the holographic recording medium and the transparent refracting medium to enhance optical coupling by filling in any such gaps. Examples of liquid or gel transparent refracting materials include water, oils (e.g., silicone oils, vegetable oils, mineral oils), optically clear elastomeric polymers (e.g., polydimethylsiloxane, polyurethanes and derivatives thereof), and other materials known to those skilled in the art.

The geometry of the transparent refracting medium may be chosen to help achieve the desired angle of incidence. For example, if the refractive index of the transparent refracting medium is equal to that of the holographic recording medium, a flat layer of transparent refracting layer disposed on the holographic recording medium would be subject to same critical angle of incidence limitations as the holographic recording medium would have been without any transparent refracting medium. However, if the outer surface of transparent refracting medium through which exposure light will enter is angled with respect to the surface through which light will exit (and also with respect to the juxtaposed corresponding surface of the holographic recording medium), then internal angles of incidence in the holographic recording medium can be achieved that exceed the critical angle that the holographic recording medium would otherwise exhibit in air. In one exemplary embodiment, a prism geometry configuration may be utilized for the transparent refracting medium. Other geometries, such as hemi-parabolic, hemi-circular, or hemi-spherical, may also be utilized. These descriptions, however, are not limiting. For example, the transparent refracting medium need not even be solid. Thus, in another exemplary embodiment, the holographic recording medium may be disposed in a liquid transparent refracting medium (e.g., water) such that the surface of the holographic recording medium is disposed at an angle to (i.e., not parallel with) the liquid surface. Exposure light may thus enter at an angle less than the critical angle of the liquid in air and then enter the holographic recording medium at an angle greater than the critical angle of incidence that the holographic recording medium would have in air.

Figure 3A:
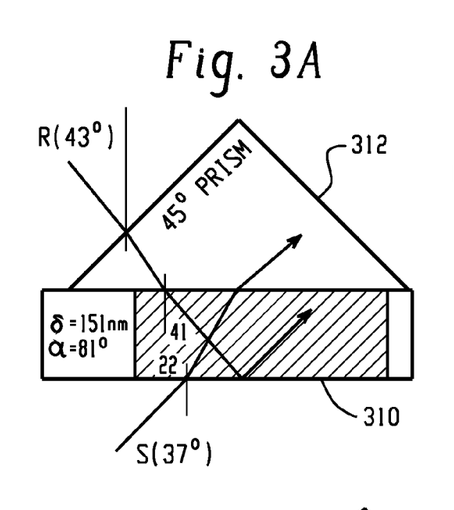
FIGS. 3A-3D depict the recording of reflection holograms using a signal exposure source of 405 nm for viewing at a 0° angle of incidence under illumination light sources at 470 nm, 532 nm, and 630 nm at a 30° angle of incidence.
Figure 3B:
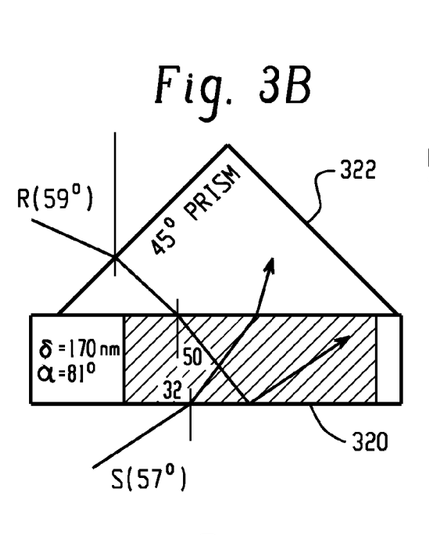
Figure 3C:
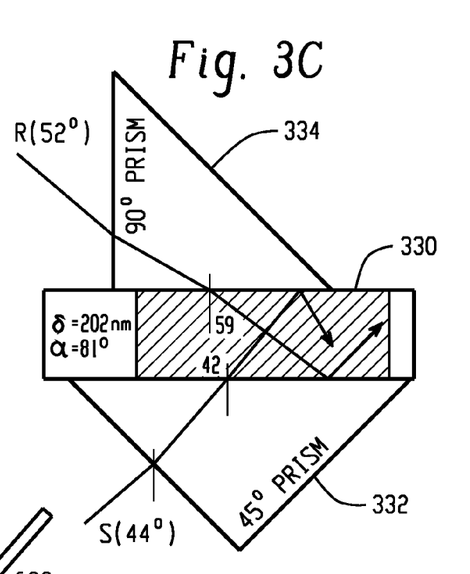
Figure 3D:
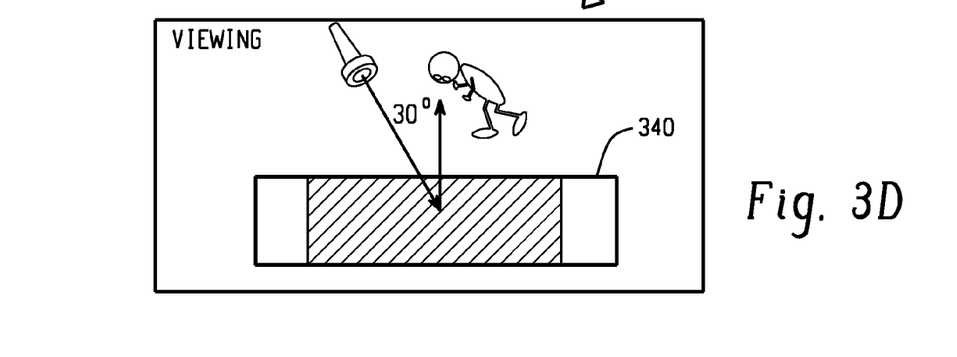
Figures 4A, 4B:
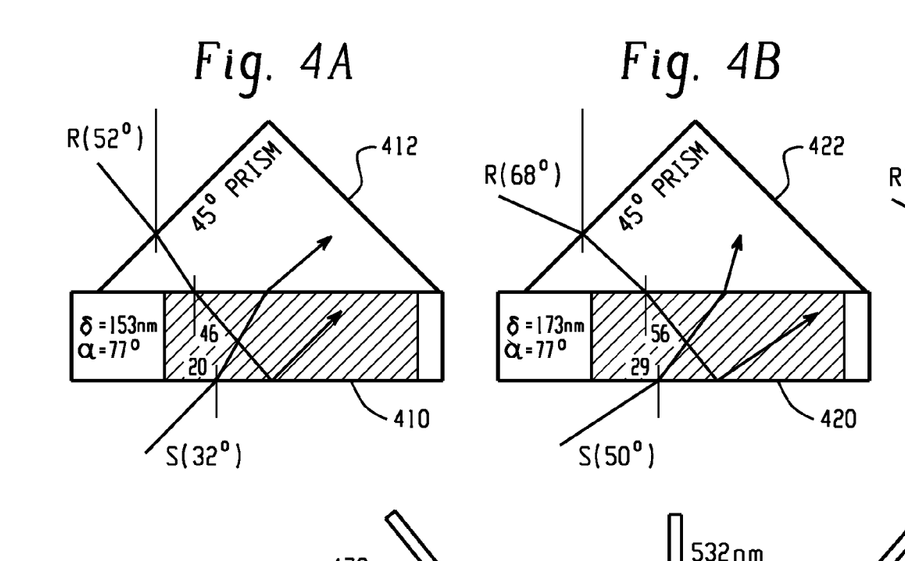
FIGS. 4A-4D depict the recording of reflection holograms using a signal exposure source of 405 for viewing at a 0° angle of incidence under illumination light sources at 470 nm, 532 nm, and 630 nm at a 45° angle of incidence.
Figure 4C:
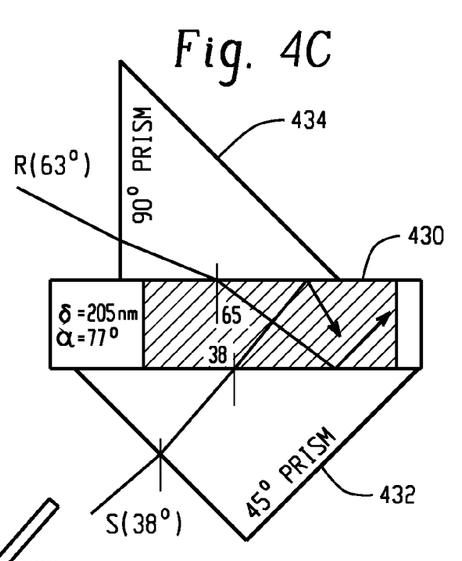
Figure 4D:
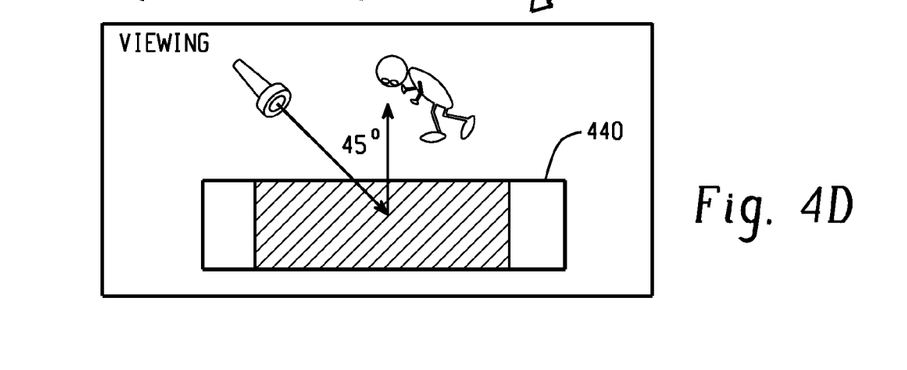

The methods described herein are further illustrated in the non-limiting exemplary embodiments depicted in FIGS. 3-4.

FIGS. 3A-3D depict the recording of reflection holograms using a signal exposure source of 405 nm for viewing at a 0° angle of incidence under illumination light sources at 470 nm, 532 nm, and 630 nm at a 30° angle of incidence. For each of the three desired illumination wavelengths and illumination/viewing angles of incidence, formulas (1) and (2) as described yield optimized angles of incidence for the signal and reference exposure sources at the exposure wavelength of 405 nm. This optimization may be readily performed by using a mathematical software package such as Microsoft Excel Solver to vary input values of R (reference exposure angle of incidence) and S (signal exposure angle of incidence) to achieve the values of fringe spacing ($\delta$) and fringe angle ($\alpha$) necessary to produce a diffraction image at the desired illumination wavelengths and illumination/viewing angles of incidence. As shown in FIG. 3A, the optimized solution for viewing at 470 nm requires an internal reference exposure angle of incidence within the holographic recording medium 310 of 41° and an internal signal exposure angle of incidence within the holographic recording medium of 22° to produce a fringe spacing $\delta$ of 151 nm and a fringe angle $\alpha$ of 81°. As shown in FIG. 3B, the optimized solution for viewing at 532 nm requires an internal reference exposure angle of incidence within the holographic recording medium 320 of 50° and an internal signal exposure angle of incidence within the holographic recording medium of 32° to produce a fringe spacing $\delta$ of 170 nm and a fringe angle $\alpha$ of 81°. As shown in FIG. 3C, the optimized solution for viewing at 630 nm requires an internal reference exposure angle of incidence within the holographic recording medium 330 of 59° and an internal signal exposure angle of incidence within the holographic recording medium of 42° to produce a fringe spacing $\delta$ of 202 nm and a fringe angle $\alpha$ of 81°. As the required internal angles of incidence are greater than the critical angle of incidence of the holographic recording medium in air for the reference exposure in FIGS. 3A and 3B, and for both the reference and signal exposures in FIG. 3C, prisms are optically coupled to the holographic recording media and the exposure beams are passed through the prisms. 45° prisms 312, 322, and 332 are used for the reference exposure beams in FIGS. 3A and 3B and for the signal exposure beam in FIG. 3C, and a 90° prism 334 is used for the reference exposure beam in FIG. 3C. As shown in FIG. 3D, the three holographic recording media 310, 320, and 330 may be disposed together in a single holographic article 340 to produce a three-color image. Alternatively, the three diffraction gratings may be recorded overlapping in the same space, provided that there is a high enough concentration of recording material (e.g., photochemically active dye) to accommodate the overlapping gratings. It is noted that the fringe angle $\alpha$ was the same for each hologram (81°). This produces a three-color image at the viewing position, but it is not required if different image patterns are desired.

FIGS. 4A-4D depict the recording of reflection holograms using an exposure source of 405 nm for viewing at a 0° angle of incidence under illumination light sources at 470 nm, 532 nm, and 630 nm at a 45° angle of incidence. For each of the three desired illumination wavelengths and illumination/viewing angles of incidence, formulas (1) and (2) as described yield optimized angles of incidence for the signal and reference exposure sources at the exposure wavelength of 405 nm. Again, this optimization may be readily performed by using a mathematical software package such as Microsoft Excel Solver to vary input values of R (reference exposure angle of incidence) and S (signal exposure angle of incidence) to achieve the values of fringe spacing ($\delta$) and fringe angle ($\alpha$) necessary to produce a diffraction image at the desired illumination wavelengths and illumination/viewing angles of incidence. As shown in FIG. 4A, the optimized solution for viewing at 470 nm requires an internal reference exposure angle of incidence within the holographic recording medium 410 of 46° and an internal signal exposure angle of incidence within the holographic recording medium of 20° to produce a fringe spacing $\delta$ of 153 nm and a fringe angle $\alpha$ of 77°. As shown in FIG. 4B, the optimized solution for viewing at 532 nm requires an internal reference exposure angle of incidence within the holographic recording medium 420 of 56° and an internal signal exposure angle of incidence within the holographic recording medium of 29° to produce a fringe spacing $\delta$ of 173 nm and a fringe angle $\alpha$ of 77°. As shown in FIG. 4C, the optimized solution for viewing at 630 nm requires an internal reference exposure angle of incidence within the holographic recording medium 330 of 63° and an internal signal exposure angle of incidence within the holographic recording medium of 38° to produce a fringe spacing $\delta$ of 205 nm and a fringe angle $\alpha$ of 77°. As the required internal angles of incidence are greater than the critical angle of incidence of the holographic recording medium in air for the reference exposure in FIGS. 4A, 4B, and 4C, prisms are optically coupled to the holographic recording media and the exposure beams are passed through the prisms. The signal exposure internal angle of incidence for FIG. 4C is less than the critical angle of incidence, but the external angle of incidence needed to achieve the internal angle of incidence of 38° would be so close to 90° that significant optical distortion of the image being recorded would be incurred, so a prism is used for the signal exposure beam in FIG. 4C as well. 45° prisms 412, 422, and 432 are used for the reference exposure beams in FIGS. 4A and 4B and for the signal exposure beam in FIG. 4C, and a 90° prism 434 is used for the reference exposure beam in FIG. 4C. As shown in FIG. 4D, the three holographic recording media 410, 420, and 430 may be disposed together in a single holographic article 440 to produce a three-color image. Alternatively, the three diffraction gratings may be recorded overlapping in the same piece of recording media, provided that there is sufficient dynamic range in the recording material (e.g., high enough concentration of photochemically active dye) to accommodate the overlapping gratings. It is noted that the fringe angle $\alpha$ was the same for each hologram (77°). This produces a three-color image at the viewing position, but it is not required if different image patterns are desired.

Depending on the holographic medium used, no additional processing may be needed to visualize the hologram, though in some cases the medium can optionally be further processed after the hologram has been formed. Further processing can comprise various post processing treatments generally employed with holographic media, such as heat treatment, light treatment, chemical treatment, application of other layers (e.g., weatherable films (e.g., UV and/or IR, or scratch/wear protective)). Also, since the interference fringe spacings were formed such that the hologram could be reconstructed with the holographic medium in its natural state (i.e., not deformed), the medium can be further processed in a manner to inhibit subsequent deformation. For example, the holographic medium can be coated on one or both sides, cured, shaped, attached to an article, and so forth, as well as combinations comprising at least one of the foregoing processes. For example, a hard coat can be applied to the holographic medium, the medium can be supported (e.g., attached to a substrate), and/or if the holographic medium includes a curable material, the material can be cured. For example, the cured/hardened holographic medium (comprising the hologram) can then be applied to an article to provide security or authenticity verification. The hologram can be attached to the article by various methods including laminating, bonding, gluing, coating, and the like.

The holographic medium includes a photosensitive material (e.g., a photochromic dye, photopolymer, photographic emulsion, dichromated gelatin, etc.). In an exemplary embodiment, the holographic recording medium may be a composition comprising a binder and the photochemically active material (e.g., photochromic dye) that is capable of recording a hologram. Photopolymer holographic recording media have been successfully used for multicolor reflection volume holograms by swelling the unreacted photopolymer composition with solvent prior to exposure or after, followed by removal of the solvent and concomitant shrinkage to produce fringe patterns with modified spacing. This technique, however, is less effective for holographic recording compositions comprising a photoreactive material dispersed in an already polymerized plastic binder because of adverse impacts of the swelling process on the optical properties of the binder, which are not as problematic for the lower molecular weight photopolymer composition. Accordingly, in an exemplary embodiment, the methods described herein are employed with a holographic recording medium comprising a photochemically active material such as a photochemically active (i.e., photochromic) dye dispersed in a plastic polymer binder.

The binder composition can include inorganic material(s), organic material(s), or a combination of inorganic material(s) with organic material(s), wherein the binder has sufficient deformability (e.g., elasticity and/or plasticity) to enable the desired number of deformation states (e.g., number of different deformation ratios) for the desired recording. The binder should be an optically transparent material, e.g., a material that will not interfere with the reading or writing of the hologram. As used herein, the term "optically transparent" means that an article (e.g., layer) or a material capable of transmitting a substantial portion of incident light, wherein a substantial portion can be greater than or equal to 70% of the incident light. The optical transparency of the layer may depend on the material and the thickness of the layer. The optically transparent holographic layer may also be referred to as a holographic layer.

Exemplary organic materials include optically transparent organic polymer(s) that are elastically deformable. In one embodiment, the binder composition comprises elastomeric material(s) (e.g., those which provide compressibility to the holographic medium). Exemplary elastomeric materials include those derived from olefins, monovinyl aromatic monomers, acrylic and methacrylic acids and their ester derivatives, as well as conjugated dienes. The polymers formed from conjugated dienes can be fully or partially hydrogenated. The elastomeric materials can be in the form of homopolymers or copolymers, including random, block, radial block, graft, and core-shell copolymers. Combinations of elastomeric materials can be used.

Possible elastomeric materials include thermoplastic elastomeric polyesters (commonly known as TPE) include polyetheresters such as poly(alkylene terephthalate)s (particularly poly[ethylene terephthalate] and poly[butylene terephthalate]), e.g., containing soft-block segments of poly(alkylene oxide), particularly segments of poly(ethylene oxide) and poly(butylene oxide); and polyesteramides such as those synthesized by the condensation of an aromatic diisocyanate with dicarboxylic acids and a carboxylic acid-terminated polyester or polyether prepolymer. One example of an elastomeric material is a modified graft copolymer comprising (i) an elastomeric (i.e., rubbery) polymer substrate having a glass transition temperature (Tg) less than 10° C., more specifically less than −10° C., or more specifically −400° to −80° C., and (ii) a rigid polymeric superstrate grafted to the elastomeric polymer substrate. Exemplary materials for use as the elastomeric phase include, for example, conjugated diene rubbers, for example polybutadiene and polyisoprene; copolymers of a conjugated diene with less than 50 wt % of a copolymerizable monomer, for example a monovinylic compound such as styrene, acrylonitrile, n-butyl acrylate, or ethyl acrylate; olefin rubbers such as ethylene propylene copolymers (EPR) or ethylene-propylene-diene monomer rubbers (EPDM); ethylene-vinyl acetate rubbers; silicone rubbers; elastomeric $C_{1-8}$ alkyl(meth)acrylates; elastomeric copolymers of $C_{1-8}$ alkyl (meth)acrylates with butadiene and/or styrene; or combinations comprising at least one of the foregoing elastomers. Exemplary materials for use as the rigid phase include, for example, monovinyl aromatic monomers such as styrene and alpha-methyl styrene, and monovinylic monomers such as acrylonitrile, acrylic acid, methacrylic acid, and the $C_1$-$C_6$ esters of acrylic acid and methacrylic acid, specifically methyl methacrylate. As used herein, the term "(meth) acrylate" encompasses both acrylate and methacrylate groups.

Specific exemplary elastomer-modified graft copolymers include those formed from styrene-butadiene-styrene (SBS), styrene-butadiene rubber (SBR), styrene-ethylene-butadiene-styrene (SEBS), ABS (acrylonitrile-butadiene-styrene), acrylonitrile-ethylene-propylene-diene-styrene (AES), styrene-isoprene-styrene (SIS), methyl methacrylate-butadiene-styrene (MBS), and styrene-acrylonitrile (SAN).

Exemplary organic materials that can also optionally be employed in the binder composition are optically transparent organic polymers. The organic polymer can be thermoplastic polymer(s), thermosetting polymer(s), or a combination comprising at least one of the foregoing polymers. The organic polymers can be oligomers, polymers, dendrimers, ionomers, copolymers such as for example, block copolymers, random copolymers, graft copolymers, star block copolymers; or the like, or a combination comprising at least one of the foregoing polymers. Exemplary thermoplastic organic polymers that can be used in the binder composition include, without limitation, polyacrylates, polymethacrylates, polyesters (e.g., cycloaliphatic polyesters, resorcinol arylate polyester, and so forth), polyolefins, polycarbonates, polystyrenes, polyesters, polyamideimides, polyarylates, polyarylsulfones, polyethersulfones, polyphenylene sulfides, polysulfones, polyimides, polyetherimides, polyetherketones, polyether etherketones, polyether ketone ketones, polysiloxanes, polyurethanes, polyethers, polyether amides, polyether esters, or the like, or a combination comprising at least one of the foregoing thermoplastic polymers, such as polycarbonate and polyester.

Organic polymers that are not transparent to electromagnetic radiation can also be used in the binder composition if they can be modified to become transparent. For examples, polyolefins are not normally optically transparent because of the presence of large crystallites and/or spherulites. However, by copolymerizing polyolefins, they can be segregated into nanometer-sized domains that cause the copolymer to be optically transparent.

In one embodiment, the organic polymer and photochromic dye can be chemically attached. The photochromic dye can be attached to the backbone of the polymer. In another embodiment, the photochromic dye can be attached to the polymer backbone as a substituent. The chemical attachment can include covalent bonding, ionic bonding, or the like.

Binary blends, ternary blends and blends having more than three resins may also be used in the polymeric alloys. When a binary blend or ternary blend is used in the polymeric alloy, one of the polymeric resins in the alloy comprises 1 to 99 weight percent (wt %) based on the total weight of the composition. Within this range, it is generally desirable to have the one of the polymeric resins in an amount greater than or equal to 20, preferably greater than or equal to 30 and more preferably greater than or equal to 40 wt %, based on the total weight of the composition. Also desirable within this range, is an amount of less than or equal to 90, preferably less than or equal to 80 and more preferably less than or equal to 60 wt % based on the total weight of the composition. When ternary blends of blends having more than three polymeric resins are used, the various polymeric resins may be present in any desirable weight ratio. In all cases, the deformable component(s) of the system must comprise a majority of the polymeric alloy, such that the alloy retains the ability to deform elastically.

As noted above, in an exemplary embodiment, the photoactive material is a photochromic dye. The photochromic dye is one that is capable of being written and read by electromagnetic radiation. It is desirable to use photochromic dyes that can be written and read using actinic radiation, such as at wavelengths between 250 and 1,100 nanometers. In a more specific exemplary embodiment, the wavelengths at which writing can be accomplished can be from 350 nm to 750 nm. Many photochromic dyes that are sensitive to longer wavelengths (e.g., longer than 400 nm) may impart visible color absorption to the holographic recording medium that is aesthetically undesirable, which presents an additional barrier (beyond the complexity and expense of using multiple lasers to exposing at multiple wavelengths) for making multicolor reflection volume holograms using photochromic dye-based holographic recording media. The methods disclosed herein provide techniques for generating multicolor (full visible spectrum) holograms using photochromic dyes sensitive to light less than 500 nm, for example with a laser emitting light at 405 nm, though wavelength redshifts are possible for any writing wavelength. In an exemplary embodiment, reading/viewing can be performed at wavelengths between 400 and 500 nm (i.e., blue light). In another exemplary embodiment, reading/viewing can be performed at wavelengths between 500 and 600 nm (i.e., green light). In yet another exemplary embodiment, reading/viewing can be performed at wavelengths between 600 and 750 nm (i.e., red light).

Examples of photochromic dyes include diarylethenes and a nitrones.

An exemplary diarylethylene compound can be represented by formula (XI)

(XI)

wherein n is 0 or 1; $R^1$ is a single covalent bond ($C_0$), $C_1$-$C_3$ alkylene, $C_1$-$C_3$ perfluoroalkylene, oxygen; or —N(CH$_2$)$_x$CN wherein x is 1, 2, or 3; when n is 0, Z is $C_1$-$C_5$ alkyl, $C_1$-$C_5$ perfluoroalkyl, or CN; when n is 1, Z is CH$_2$, CF$_2$, or C=O; $Ar^1$ and $Ar^2$ are each independently i) phenyl, anthracene, phenanthrene, pyridine, pyridazine, 1H-phenalene or naphthyl, substituted with 1-3 substituents wherein the substituents are each independently $C_1$-$C_3$ alkyl, $C_1$-$C_3$ perfluoroalkyl, or fluorine; or ii) represented by following formulas:

(XII)

(XIII)

(XIV)

(XV)

wherein $R^2$ and $R^5$ are each independently $C_1$-$C_3$ alkyl or $C_1$-$C_3$ perfluoroalkyl; $R^3$ is $C_1$-$C_3$ alkyl, $C_1$-$C_3$ perfluoroalkyl, hydrogen, or fluorine; $R^4$ and $R^6$ are each independently $C_1$-$C_3$ alkyl, $C_1$-$C_3$ perfluoroalkyl, CN, hydrogen, fluorine, phenyl, pyridyl, isoxazole, —CHC(CN)$_2$, aldehyde, carboxylic acid, —(C$_1$-C$_5$ alkyl)COOH or 2-methylenebenzo[d][1,3]dithiole; wherein X and Y are each independently oxygen, nitrogen, or sulfur, wherein the nitrogen is optionally substituted with $C_1$-$C_3$ alkyl or $C_1$-$C_3$ perfluoroalkyl; and wherein Q is nitrogen.

Examples of diarylethenes that can be used as photoactive materials include diarylperfluorocyclopentenes, diarylmaleic anhydrides, diarylmaleimides, or a combination comprising at least one of the foregoing diarylethenes. The diarylethenes are present as open-ring or closed-ring isomers. In general, the open ring isomers of diarylethenes have absorption bands at shorter wavelengths. Upon irradiation with ultraviolet light, new absorption bands appear at longer wavelengths, which are ascribed to the closed-ring isomers. In general, the absorption spectra of the closed-ring isomers depend on the substituents of the thiophene rings, naphthalene rings or the phenyl rings. The absorption structures of the open-ring isomers depend upon the upper cycloalkene structures. For example, the open-ring isomers of maleic anhydride or maleimide derivatives show spectral shifts to longer wavelengths in comparison with the perfluorocyclopentene derivatives.

Examples of diarylethene closed ring isomers include:

(XVI)

-continued (XVII)

(XVIII)

(XIX)

(XX)

(XXI)

(XXII)

(XXIII)

-continued

(XXIV)

(XXV)

(XXVI)

(XXVII)

(XXVIII)

(XXIX)

-continued

(XXX)

(XXXI)

(XXXII)

(XXXIII)

(XXXIV)

(XXXV)

(XXXVI)

(XXXVII)

(XXXVIII)

where iPr represents isopropyl;

(XXXIX)

(XXXX)

(XXXXI)

(XXXXII)

(XXXXIII)

and combinations comprising at least one of the foregoing diarylethenes.

Diarylethenes with five-membered heterocyclic rings have two conformations with the two rings in mirror symmetry (parallel conformation) and in $C_2$ (antiparallel conformation). In general, the population ratio of the two conformations is 1:1. In one embodiment, it is desirable to increase the ratio of the antiparallel conformation to facilitate an increase in the quantum yield, which is further described in detail below. Increasing the population ratio of the antiparallel conformation to the parallel conformation can be accomplished by covalently bonding bulky substituents such as the —($C_1$-$C_5$ alkyl)COOH substituent to diarylethenes having five-membered heterocyclic rings.

In another embodiment, the diarylethenes can be in the form of a polymer having the general formula (XXXXIV) below. The formula (XXXXIV) represents the open isomer form of the polymer.

where Me represents methyl, $R^1$, X and Z have the same meanings as explained above in formulas (XI) through (XV) and n is any number greater than 1.

Polymerizing the diarylethenes can also be used to increase the population ratio of the antiparallel conformations to the parallel conformations.

The diarylethenes can be reacted in the presence of light. In one embodiment, an exemplary diarylethene can undergo a reversible cyclization reaction in the presence of light according to the following equation (I):

(I)

where X, Z $R^1$ and n have the meanings indicated above; and wherein Me is methyl. The cyclization reaction can be used to produce a hologram. The hologram can be produced by using radiation to react the open isomer form to the closed isomer form or vice-versa.

A similar reaction for an exemplary polymeric form of diarylethene is shown below in the equation (II)

(XXXXIV)

(II)

where X, Z R[1] and n have the meanings indicated above; and wherein Me is methyl.

As noted above, in yet another embodiment, a diarylethene can undergo a gated reaction in the presence of light. As noted above, diarylethenes with five-membered heterocyclic rings have two conformations with the two rings in mirror symmetry (parallel conformation) and in $C_2$ (antiparallel conformation). Photocyclization can proceed only from the antiparallel conformation. The photocyclization is prohibited when the compound is fixed in the mirror symmetry conformation. As can be seen in the equation (III) below, the formation of intramolecular hydrogen bonding fastens the compound in the parallel conformation thereby making the compound photochemically inactive. Heat can be used to break this intramolecular hydrogen bonding. Diarylethene compounds having special substituents that reversibly fix the conformation undergo gated photochromic reactions, according to the following equation (III):

(III)

Equation (III) is termed a gated reaction and can preserve stored data even when readout operations are repeatedly conducted at the same wavelength as the writing operation. Thus by using diarylethenes in which gating is made to occur, the writing and reading can be conducted at the same wavelength.

Nitrones can also be used as photochromic dyes in the holographic recording media. Nitrones have the general structure shown in the formula (XXXXV):

(XXXXV)

An exemplary nitrone generally comprises an aryl nitrone structure represented by the formula (XXXXVI):

(XXXXVI)

wherein Z is $(R^3)_a$-Q-$R^4$— or $R^5$—; Q is a monovalent, divalent or trivalent substituent or linking group; wherein each of R, $R^1$, $R^2$ and $R^3$ is independently hydrogen, an alkyl or substituted alkyl radical containing 1 to 8 carbon atoms or an aromatic radical containing 6 to 13 carbon atoms; $R^4$ is an aromatic radical containing 6 to 13 carbon atoms; $R^5$ is an aromatic radical containing 6 to 20 carbon atoms which have substituents that contain hetero atoms, wherein the hetero atoms are at least one of oxygen, nitrogen or sulfur; $R^6$ is an aromatic hydrocarbon radical containing 6 to 20 carbon atoms; X is a halo, cyano, nitro, aliphatic acyl, alkyl, substituted alkyl having 1 to 8 carbon atoms, aryl having 6 to 20 carbon atoms, carbalkoxy, or an electron withdrawing group in the ortho or para position selected from the group consisting of where $R^7$ is a an alkyl radical having 1 to 8 carbon atoms; a is an amount of less than or equal to 2; b is an amount less than or equal to 3; and n is less than or equal to 4.

As can be seen from formula (XXXXVI), the nitrones may be α-aryl-N-arylnitrones or conjugated analogs thereof in which the conjugation is between the aryl group and an α-carbon atom. The α-aryl group is frequently substituted, most often by a dialkylamino group in which the alkyl groups contain 1 to 4 carbon atoms. The $R^2$ is hydrogen and $R^6$ is phenyl. Q can be monovalent, divalent or trivalent according as the value of "a" is 0, 1 or 2. Illustrative Q values are shown in the Table 1 below.

TABLE 1

| Valency of Q | Identity of Q |
|---|---|
| Monovalent | fluorine, chlorine, bromine, iodine, alkyl, aryl; |
| Divalent | oxygen, sulphur, carbonyl, alkylene, arylene. |
| Trivalent | nitrogen |

It is desirable for Q to be fluorine, chlorine, bromine, iodine, oxygen, sulfur or nitrogen.

Examples of nitrones are α-(4-diethylaminophenyl)-N-phenylnitrone; α-(4-diethylaminophenyl)-N-(4-chlorophenyl)-nitrone, α-(4-diethylaminophenyl)-N-(3,4-dichlorophenyl)-nitrone, α-(4-diethylaminophenyl)-N-(4-carbethoxyphenyl)-nitrone, α-(4-diethylaminophenyl)-N-(4-acetylphenyl)-nitrone, α-(4-dimethylaminophenyl)-N-(4-cyanophenyl)-nitrone, α-(4-methoxyphenyl)-N-(4-cyanophenyl)nitrone, α-(9-julolidinyl)-N-phenylnitrone, α-(9-julolidinyl)-N-(4-chlorophenyl)nitrone, α-[2-(1,1-diphenylethenyl)]-N-phenylnitrone, α-[2-(1-phenylpropenyl)]-N-phenylnitrone, or the like, or a combination comprising at least one of the foregoing nitrones. Aryl nitrones are particularly useful in the compositions and articles disclosed herein. An exemplary aryl nitrone is α-(4-diethylaminophenyl)-N-phenylnitrone.

Upon exposure to electromagnetic radiation, nitrones undergo unimolecular cyclization to an oxaziridine as shown in the structure (XXXXVII)

(XXXXVII)

wherein R, $R^1$, $R^2$, $R^6$, n, $X_b$ and Z have the same meaning as denoted above for the structure (XXXXVI).

The holographic composition is advantageous in that it permits manufacturing a holographic recording medium in an efficient and cost effective manner. It also allows for fast replication and can be handled by the end-user. The process further allows recording at one wavelength and reconstruction at another. For example, recording can be accomplished outside the visible range, while reading is within the visible range, or vice versa.

Also disclosed herein are the holograms formed by the above methods and articles comprising the holograms. For example, the holograms formed herein can be utilized in various mediums such as: (i) in an authentication device for product security, (ii) in documents of value (e.g., a credit card, an identification card, hotel room key, an access key, a passport, a bill of currency, and so forth), an authentication tag, a shipping manifest, a bill of lading, an electronic information storage device, (iii) for aesthetics (e.g., on a toy, sign, tag, etc.), and/or (iv) in a measuring device (such as in a gauge or indicator (such as a strain gauge, e.g., depending upon the amount of strain, the image and/or color changes)).

In one embodiment, a hologram comprises: a holographic recording medium comprising a photochemically active dye and a photoproduct of the photochemically active dye in an optically transparent material.

In the various embodiments, multiple holographic images with different fringe spacings can be recorded. For example, (i) a first hologram can be recorded in the holographic recording medium at a first fringe spacing and alignment, (ii) a second hologram can be recorded in the holographic recording medium at a second fringe spacing and alignment, and/or (iii) the method further may further comprise recording a third hologram at a third fringe spacing and alignment, and/or (iv) the first, second and third holograms may be recorded at the same laser wavelength, and/or (v), the chemical composition of the holographic recording medium in each of the holographic recording media may be the same.

Ranges disclosed herein are inclusive and combinable (e.g., ranges of "up to 25 wt %, or, more specifically, 5 wt % to 20 wt %", is inclusive of the endpoints and all intermediate values of the ranges of "5 wt % to 25 wt %," etc.). "Combination" is inclusive of blends, mixtures, alloys, reaction products, and the like. Furthermore, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The suffix "(s)" as used herein is intended to include both the singular and the plural of the term that it modifies, thereby including one or more of that term (e.g., the colorant(s) includes one or more colorants). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

While the invention has been described with reference to exemplary embodiments, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention.

The invention claimed is:

1. A method for recording a volume reflection holographic image in a transparent holographic recording medium comprising a photochemically active dye dispersed in a polymer binder having a refractive index n, said holographic recording medium being photosensitive to external light provided at a wavelength W of 300-500 nm;

disposing a first transparent prism having a first prism first surface optically coupled with a first surface of the holographic recording medium and a first prism second surface at about a 45° angle to the first prism first surface, and exposing the holographic recording medium to a first signal coherent light source that includes image or other information to be recorded in the holographic recording medium and a first reference coherent light source, said first signal coherent light source and first reference coherent light source emitting light at the wavelength W such that light from one of the first signal and reference coherent light sources enters the first prism through the first prism second surface and exits the first prism through the first prism first surface to enter the holographic recording medium through the first surface, and light from the other of the first signal and reference coherent light sources enters a second opposing surface of the holographic recording medium to produce a holographic image viewable at an angle of incidence $S_V$ when illuminated by light at a wavelength of $W_{V1}$ between 400 nm and 500 nm;

disposing a second transparent prism having a second prism first surface optically coupled with the first surface of the holographic recording medium and a second prism second surface at about a 45° angle to the second prism first surface, and exposing the holographic recording medium to a second signal coherent light source that includes image or other information to be recorded in the holographic recording medium and a second reference coherent light source, said second signal coherent light source and second reference coherent light source emitting light at the wavelength W such that light from one of the second signal and reference coherent light sources enters the second prism through the second prism second surface and exits the second prism through the second prism first surface to enter the holographic recording medium through the first surface, and light from the other of the second signal and reference coherent light sources enters the second opposing surface of the holographic recording medium to produce a holographic image viewable at an angle of incidence $S_V$ when illuminated by light at a wavelength of $W_{V1}$ between 500 nm and 600 nm; and disposing a third transparent prism having a third prism first surface optically coupled with the first surface of the holographic recording medium and a third prism second surface at about a 90° angle to the third prism first surface, disposing a fourth transparent prism having a fourth prism first surface optically coupled with the second opposing surface of the holographic recording medium and a fourth prism second surface at about a 45° angle to the fourth prism first surface, and exposing the holographic recording medium to a third signal coherent light source that includes image or other information to be recorded in the holographic recording medium and a third reference coherent light source, said third signal coherent light source and third reference coherent light source emitting light at the wavelength W such that light from one of the third signal and reference coherent light sources enters the third prism through the third prism second surface and exits the third prism through the third prism first surface to enter the holographic recording medium through the first surface, and light from the other of the third signal and reference coherent light sources enters the fourth prism through the fourth prism second surface and exits the fourth prism through the fourth prism first surface to enter the holographic recording medium through the second opposing surface of the holographic recording medium to produce a holographic image viewable at an angle of incidence $S_V$ when illuminated by light at a wavelength of $W_{V1}$ between 600 nm and 750 nm.

2. The method of claim 1, wherein the first signal coherent light source and the second signal coherent light source each pass through the first and second transparent prisms, respectively, before entering the holographic recording medium.

3. The method of claim 1, wherein the first reference coherent light source and the second reference coherent light source each pass through the first and second transparent prisms, respectively, before entering the holographic recording medium.

4. The method of claim 1, wherein W is about 405 nm.

5. The method of claim 1, further comprising a liquid or gel transparent refracting material disposed between and optically coupling the transparent prisms and the holographic recording medium.

6. The method of claim 5, wherein the liquid or gel transparent refracting material, the transparent prism, and the holographic recording medium each have a refractive indices within 0.6 of one another.

7. The method of claim 1, wherein the photochemically active dye is a nitrone, dinitrostilbene, diarylethylene, or a cinnamate.

* * * * *